(12) United States Patent
Monson et al.

(10) Patent No.: US 6,480,391 B1
(45) Date of Patent: Nov. 12, 2002

(54) MODULAR CAGE FOR AN ELECTRONIC COMPONENT

(75) Inventors: William Michael Monson, Rochester, MN (US); John Lee Colbert, Byron, MN (US); Steven Dale Greseth, Rochester, MN (US); Mark G. Clark, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/481,521

(22) Filed: Jan. 12, 2000

(51) Int. Cl.⁷ .............................. H05K 5/00; H05K 5/02
(52) U.S. Cl. ..................... 361/752; 361/724; 361/725; 361/753; 361/756; 361/788; 361/796; 361/829; 312/223.1; 312/223.2; 312/265.6; 312/257.1
(58) Field of Search ................... 361/796, 684, 361/740, 741, 747, 753, 756, 758, 759, 799, 801, 802, 736, 742, 743, 769, 770, 774, 804, 773, 772, 818

(56) References Cited

U.S. PATENT DOCUMENTS

| | | | | | |
|---|---|---|---|---|---|
| 4,265,500 | A | * | 5/1981 | Berton | 312/107 |
| 4,356,531 | A | * | 10/1982 | Marino et al. | 312/265.5 |
| 4,530,033 | A | * | 7/1985 | Meggs | 361/759 |
| 6,154,361 | A | * | 11/2000 | Anderson et al. | 312/223.1 |
| 6,185,109 | B1 | * | 2/2001 | Koradia et al. | 361/818 |
| 6,325,472 | B1 | * | 12/2001 | Tirrell et al. | 312/223.1 |

OTHER PUBLICATIONS

Machinery's Handbook, 24th edition, 1992, ed. Robert Green, Industrial Press Inc., pp. 531–532 and 1240.*

* cited by examiner

Primary Examiner—David L. Talbott
Assistant Examiner—John B. Vigushin
(74) Attorney, Agent, or Firm—Rabin & Champagne, PC; Robert H. Berdo, Jr.

(57) ABSTRACT

A cage for an electronic component includes two spaced apart cast walls, and a roof member and a floor member connected to the two spaced apart cast walls. The walls are substantially identical, and the roof member and the floor member are each formed of a damped metallic laminate panel.

35 Claims, 8 Drawing Sheets

MODULAR CAGE FOR AN ELECTRONIC COMPONENT

BACKGROUND OF THE INVENTION

1. Field of the Invention

The invention relates to a modular cage for an electronic component, and in particular, to a modular cage formed from a plurality of standardized walls that can be joined together to create a variety of configurations for accommodating a variety of different number of electronic components therein.

2. Background Information

Electronic components, such as direct access storage devices (DASDs), for example, are typically individually disposed within a so-called "sled" or tray, which in turn is mounted in a housing or cage containing many DASDs. The cage helps to position and align the individual DASDs relative to a backplane, to which the DASDs are connected in a known manner.

The known cage is typically formed from sheet metal, by bending the sheet metal to form the walls of the cage, or by fastening the sheet metal walls together using conventional means. The sheet metal of the cage is typically connected to a ground potential. Thus, during installation or removal of the DASD, the cage reduces the risk of damage to the DASD due to static electricity by electrically coupling the DASD to the cage to discharge static electricity. As is well known, static electricity may destroy sensitive circuitry of the DASD.

Moreover, while in operation, the DASDs are routinely subjected to mechanical vibration and shock. The DASDs have heads that could malfunction or be damaged by the mechanical vibration or shock while the DASDs are running. Moreover, vibrations can cause so-called soft errors in the reading of data. That is, the heads of the DASD need to be properly aligned and positioned in order to read data from a media source. Vibrations can prevent the proper tracking of the head, causing the head to "re-read" the media several times in order to acquire the data. Thus, vibrations can reduce the operational speed of the DASD. However, sheet metal has relatively poor damping qualities. Thus, the known sheet metal cages do not significantly dampen vibrations. There is thus a need for a cage that has high damping attributes, so that vibrations are reduced.

It is also known to provide a sheet metal laminate known as CLD (constrained layer dampener), to help reduce vibrations. However, the process for making such a laminate is relatively time consuming and expensive. Thus, there is a need for a panel that can reduce vibrations, but that can be easily, quickly and cheaply incorporated into a cage.

Further, it is known to provide the DASD tray with springs that engage with the sheet metal roof member and floor member of the cage. The springs are used to reduce vibrations, and to hold the DASD tray in position. However, the sheet metal of the cage has a tendency to flex. As such, the springs may push the roof member and floor member away from each other, so that the springs are not held under an optimum compression. Further, it is difficult to manufacture the known cage to dimensionally accurate measurements. Thus, even without the flexing of the sheet metal, the spacing between the roof member and the floor member may not be ideal, and the springs may not be held under their optimum compression. As such, the springs may not sufficiently reduce vibrations and/or hold the DASD tray in the preferred position.

Additionally, the sheet metal walls of the cage are typically positioned relative to each other with a high degree of tolerance. However, the cage is also typically used to guide the DASD into engagement with the backplane. Thus, the conventional cage may cause a misalignment between the DASD and the backplane, preventing a positive coupling therebetween, and possibly damaging the connectors used to couple the DASD to the backplane. Therefore, there is a need for a cage that can be manufactured to precise dimensions, and that is relatively rigid, so that the resulting cage provides for dimensionally accurate guidance and increased stability of the associated DASD.

Furthermore, a DASD is typically utilized in a computer system that includes numerous electrical components that tend to generate a substantial amount of heat. Moreover, the DASD itself generates heat while operating. Because excess temperature can impair an electrical component's reliability and functionality, computer systems are typically provided with blowers that cause a cooling flow of air to pass through the cage and over the various electrical components, thus causing a transfer of heat away from the electrical components. Thus, there is a need for a cage that allows for an increased flow of cooling air therethrough, without reducing the structural integrity of the cage.

Furthermore, the conventional cage is typically tailored to hold a specific number of DASDs, for example six. Although fewer DASDs may be positioned within the conventional cage, the size of the cage remains constant. Thus, the cage tailored for six DASDs, but which is used to accommodate only two DASDs, for example, will take up extra space, that could otherwise be used to house other components. Alternatively, specific cages can be tailored to hold a precise number of DASDs. Thus, if only two DASDs are to be used, a smaller, specifically tailored DASD cage could be utilized. However, as will be appreciated, this requires a larger number of cage components to be kept in stock, which increases inventory. Moreover, each different DASD cage will need its own specific tooling in order to make the cage, thus increasing the manufacturing costs. Thus, there is a need for a cage that can be easily modified to allow for a different number of DASDs to be received therein, while occupying a minimal amount of space.

SUMMARY OF THE INVENTION

It is, therefore, a principle object of this invention to provide a modular cage for an electronic component.

It is another object of the invention to provide a modular cage for an electronic component that solves the above mentioned problems.

These and other objects of the present invention are accomplished by the modular cage for an electronic component disclosed herein.

Advantageously, according to one aspect of the present invention, the cage according to the present invention is formed by a first wall, a second wall, a floor member, and a roof member. In an exemplary aspect of the present invention, the first and second walls are identical to each other. That is, the same member can be used for either the first wall or the second wall. This advantageously reduces the total number of different parts that needs to be manufactured for the cage, thus reducing tooling times and costs, and reducing inventory.

In an exemplary aspect of the present invention, the first and second walls are manufactured by casting. This technique allows the walls to be made more quickly and cheaply, and with a greater mass than the sheet metal walls of the known cages. Thus, the resulting walls will be relatively solid, with a thickness of about 2 to 3 mm., for example, and will resist vibrations and flexing due to externally applied forces. Moreover, the cast walls can be manufactured to a higher degree of dimensional accuracy than the known sheet metal walls. Thus, the resulting cage will more accurately align and guide the DASDs into engagement with an associated backplane, for example, as compared to a conventional sheet metal cage.

Moreover, casting the walls advantageously allows various features of the walls to be cast directly therein, thus increasing the production output. Moreover, casting the walls provides for a wall that is dimensionally repeatable, that is, each wall will be substantially identical to the other walls. Thus, a cage manufactured using cast walls is believed to be more dimensionally accurate than a cage manufactured using sheet metal.

In a further exemplary aspect of the present invention, the first and second walls are formed from a material that exhibits good vibrational control, for example, zinc aluminum.

Moreover, each wall preferably has a configuration that will allow a standard DASD tray to be accommodated within the cage, in a preferred orientation, i.e., with the DASD tray and DASD arranged essentially parallel to the walls.

In a further exemplary aspect of the present invention, the walls are provided with a plurality of ribs on a surface thereof. Using ribs will allow the walls to be made thinner, thus requiring less material for the formation of the walls, while increasing the production rate of the walls by reducing casting times.

In another exemplary aspect of the invention, both the roof member and floor member include a panel formed from a prefabricated damped metallic laminate (DML). As is known, a damped metallic laminate is a laminated sheet metal material that is typically used in the automotive industry, and which exhibits good damping qualities.

In a further aspect of the present invention, the panel can be stamped or machined to include features to accommodate various system needs. This allows the cage to be easily modified for different applications, while retaining the modularity of the various components of the cage.

In an exemplary embodiment of the present invention, the roof member and the floor member each include a stiffener plate provided adjacent to the respective panels. The stiffener plates are used to increase the structural rigidity of the roof member and floor member. The stiffener plates ensure that the DASD tray, which may be provided with springs on its upper and/or lower edges, engages with the roof member and the floor member without flexing of the roof member or floor member. Thus, the springs of the DASD tray will be under optimal compression at all times, ensuring accurate alignment of the DASD and minimizing vibrations thereof.

Advantageously, the stiffener plates may be provided with features that allow other components to be attached to the cage, or which allow the cage to be easily adapted to different hardware systems. This increases the flexibility and adaptability of the cage for different applications, without interfering with the modularity or functionality of the cage.

The width of the roof member and floor member define a size of the cage. For example, if the cage is adapted to accommodate two DASDs, then the roof member and floor member will have a relatively small width, so that a relatively narrow cage will be formed. On the other hand, if the cage is adapted to accommodate more than one DASD, for example, six DASDs, the roof member and floor member will have a significantly greater width, so that a relatively wide cage will result. As will be appreciated, the present invention can thus be modified to accommodate any number of DASD trays in a simple and inexpensive manner. Moreover, although the present invention has been shown to be particularly useful in accommodating DASDs and the associated trays, it is contemplated that the present invention can be utilized in a variety of applications, for example, whenever a variety of different sized cages may be needed.

In summary, due to the modular first and second walls, the cage according to the present invention can be accurately made, without dimensional variations in the manufactured cages. As such, the cage will accurately align the DASD relative to the backplane, as these two components are plugged together.

Further, the cast walls allow the height of the cage to be held within close tolerances. Thus, each resulting cage will hold the springs of the DASD tray at an optimal compression.

Moreover, the cage can be modified in size and application using a minimal amount of design time and necessary tooling. That is, the same walls can be used for a large number of differently configured cages, by merely using different panels and stiffener plates for the roof member and floor member. Thus, a differently configured cage can be built on the manufacturing floor.

Further, a variety of mounting features can be utilized with the cage, simply by modifying the stiffener plates in an appropriate manner, without affecting the operational characteristics of the cage. That is, the vibration damping features of the present invention are determined primarily by the cast walls, and the DML panels.

Moreover, the cage significantly reduces vibrations that may otherwise affect the operation of the direct access storage device. Thus, a direct access storage device utilized in a cage manufactured in accordance with the present invention will be subjected to fewer soft errors, thus increasing the operational speed of the device.

DETAILED DESCRIPTION OF THE PREFERRED EMBODIMENTS

The invention will now be described in more detail by way of example with reference to the embodiments shown in the accompanying figures. It should be kept in mind that the following described embodiments are only presented by way of example and should not be construed as limiting the inventive concept to any particular physical configuration.

Further, in the application, and if used, the terms "upper", "lower", "front", "back", "over", "under", and similar such terms are not to be construed as limiting the invention to a particular orientation. Instead, these terms are used only on a relative basis.

Figure 1:
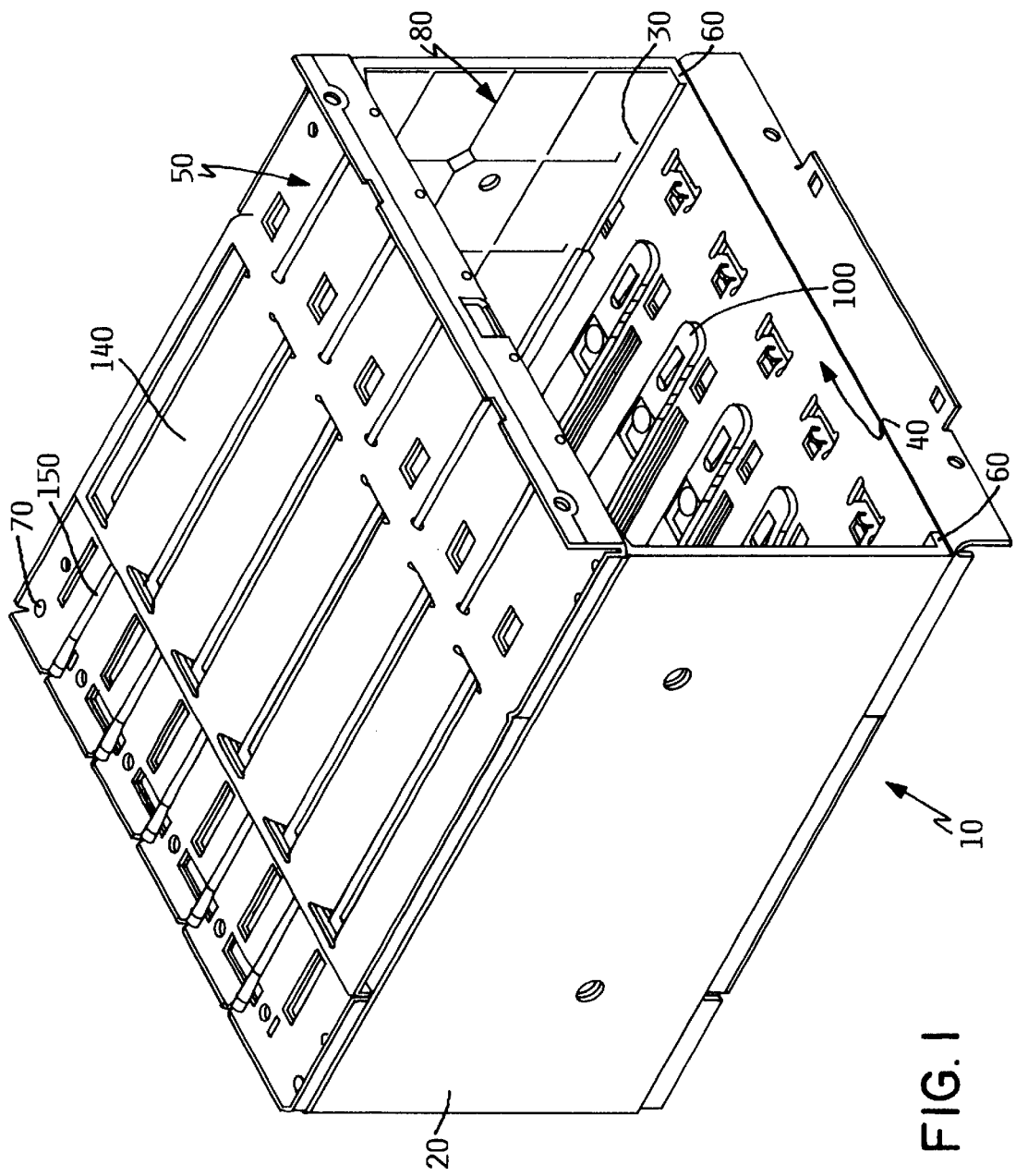
FIG. 1 is a perspective illustration of an exemplary embodiment of a cage, according to the present invention.
Figure 2:
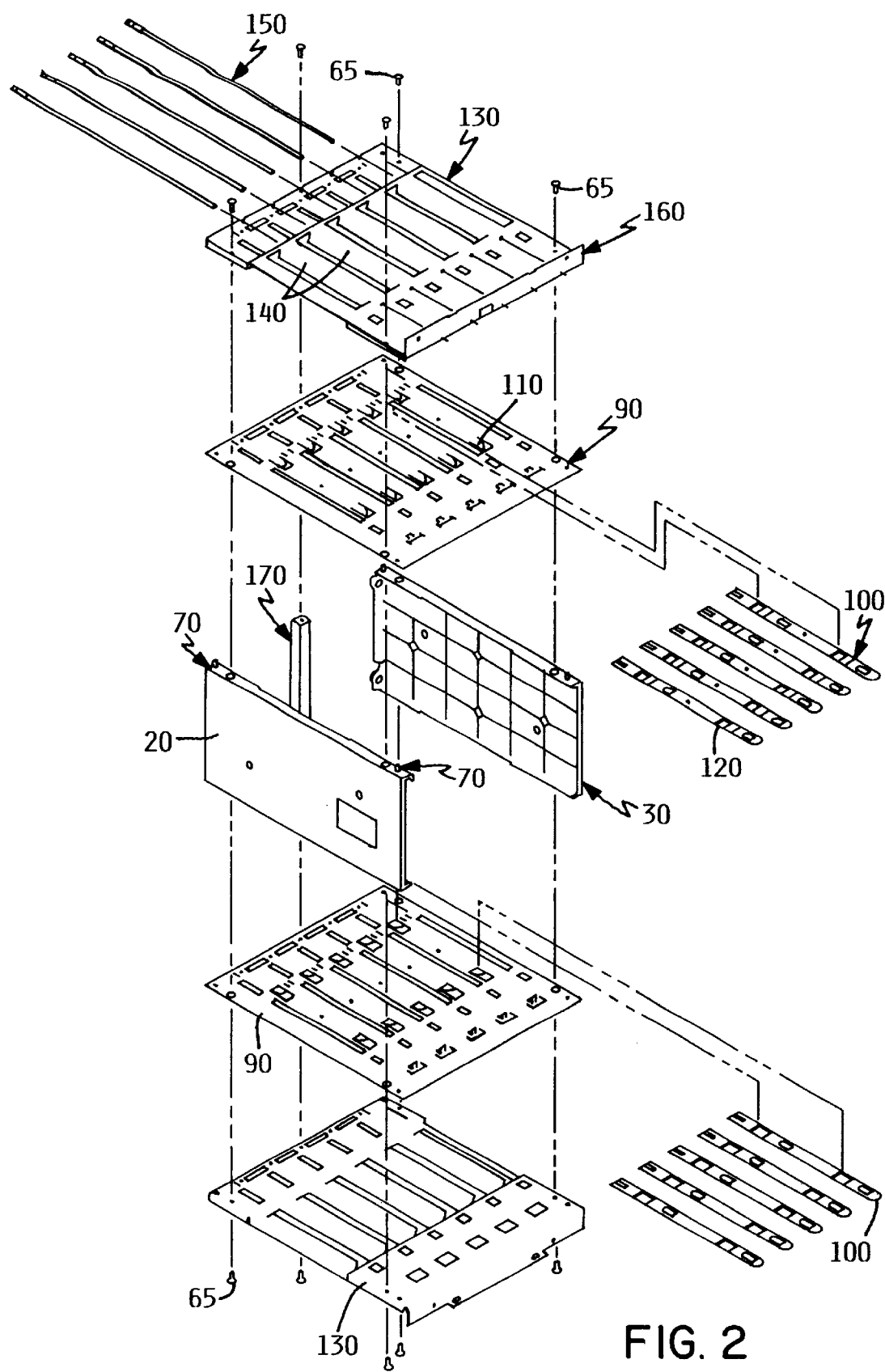
FIG. 2 is an exploded illustration of the cage shown in FIG. 1.

As shown in FIGS. 1 and 2, the cage according to the present invention is formed by a first wall 20, a second wall 30, a floor member 40, and a roof member 50. In the illustrated embodiment, the cage 10 has roughly an open parallelepiped configuration (i.e., open on two sides, and closed on four sides). However, the term "cage" is not intended to limit the present invention to any particular shape, or to any particular configuration, or to any particular material.

As shown, the first wall 20 and second wall 30 are spaced apart from each other. Moreover, in the illustrated embodiment, the first and second walls are parallel to each other. However, variations in the arrangement of the walls are within the scope of the present invention.

Preferably, the first and second walls 20, 30 are identical to each other. That is, the same member can be used for either the first wall or the second wall, so that the walls are modular. This advantageously reduces the total number of different parts that need to be manufactured for the cage 10, thus reducing tooling times and costs, and reducing inventory.

In an exemplary embodiment, the first and second walls 20, 30 are manufactured using casting techniques. This technique allows the walls 20, 30 to be made with a greater mass than the sheet metal walls of the known cages. Thus, the resulting walls 20, 30 will be relatively solid and rigid, with a thickness of about 2 to 3 mm, for example, and will better resist vibrations and flexing due to externally applied forces. Moreover, the cast walls 20, 30 can be manufactured to a higher degree of dimensional accuracy than the known sheet metal walls. Thus, the resulting cage 10 will more accurately align and guide the DASD trays and associated DASDs into engagement with an associated backplane, for example, than can a sheet metal cage.

As will be appreciated, the first and second walls 20, 30 can be manufactured using other known techniques, for example, by milling and otherwise machining the walls from a metal blank. However, it is currently believed that casting the walls is preferable, since the various features of the walls can be cast directly therein, thus increasing the production output. Moreover, casting the walls 20, 30 provides for a wall that is dimensionally repeatable, that is, each wall will be substantially identical to the other walls. In contrast, machining of the walls may cause the walls to vary in their respective dimensions, due to tool, die and machining tolerances. Thus, the cage 10 manufactured using cast walls is believed to be more dimensionally accurate than a cage manufactured using sheet metal.

Preferably, the first and second walls 20, 30 are formed from a material that exhibits good vibrational control. For example, the walls 20, 30 can be formed from zinc aluminum. Zinc aluminum is relatively inexpensive, has good vibration damping characteristics, and is suitable for casting. However, the walls 20, 30 can be formed from other materials, and in other manners, without departing from the spirit and scope of the invention.

Each wall 20, 30 preferably has a rectangular configuration, with dimensions that define a height (distance from the floor member 40 to the roof member 50) of the cage 10, and a length of the cage. For example, in an exemplary embodiment, the height of the cage 10 is about 11 cm., and a length of the cage is about 21 cm. This size will allow a standard DASD tray to be accommodated within the cage, in a preferred orientation, i.e., with the DASD tray and DASD arranged essentially parallel to the walls 20, 30.

In the exemplary illustrated embodiment, the upper and lower edges of the walls 20, 30 are provided with flanges 60, to which the roof member 50 and the floor member 40 of the cage 10 are fastened, for example, using threaded fasteners 65. Further, the flanges 60 may be provided with locating pins 70 that project through corresponding holes formed in the edges of the floor member 40 and roof member 50 of the cage 10, to properly align the floor member 40 and roof member 50 of the cage 10 to the walls 20, 30 during assembly.

As will be appreciated, the walls 20, 30 may be provided with various holes or other features, for allowing other components, for example, to be easily attached to the walls 20, 30, as needed. Moreover, in order to increase the strength of the walls 20, 30, the walls 20, 30 may be provided with a plurality of ribs 80 on a surface thereof. Using ribs 80 will allow the walls 20, 30 to be made thinner, thus requiring less material for the formation of the walls 20, 30, while increasing the production rate of the walls 20, 30 by reducing casting times.

The roof member 50 and floor member 40 of the cage 10 preferably have a rectangular configuration, with a length that corresponds to a length of the walls 20, 30. In the exemplary embodiment, the roof member 50 and floor member 40 each have a length of about 21 cm. However, it is possible to vary the length of the roof member 50 and floor member 40, so they do not correspond to the length of the walls 20, 30, without departing from the spirit and scope of the invention.

The cage 10 is formed by attaching the roof member 50 and floor member 40 to the respective flanges 60 of the respective walls 20, 30, so that the roof member 50 and floor member 40 are spaced apart from each other, and parallel to each other. As shown, this forms a cage 10 having a parallelepiped configuration. However, variations in the configuration of the cage 10 are within the scope of the present invention.

Preferably, both the roof member 50 and floor member 40 include a panel 90 formed from a prefabricated damped metallic laminate (DML). As is known, a damped metallic laminate is a material that is typically used in the automotive industry, and which exhibits good damping qualities. For example, MSC Laminates and Composites, Incorporated, of Elk Grove Village, Ill., manufactures a damped metallic laminate that is comprised of two layers of sheet metal, with a viscoelastic dampening layer therebetween, and which has been shown to provide superior damping characteristics when utilized in the cage 10 according to the present invention. Such a panel can be quickly and cheaply utilized in conjunction with the rigid walls 20, 30 to form the cage, as will be subsequently described.

Figure 3:
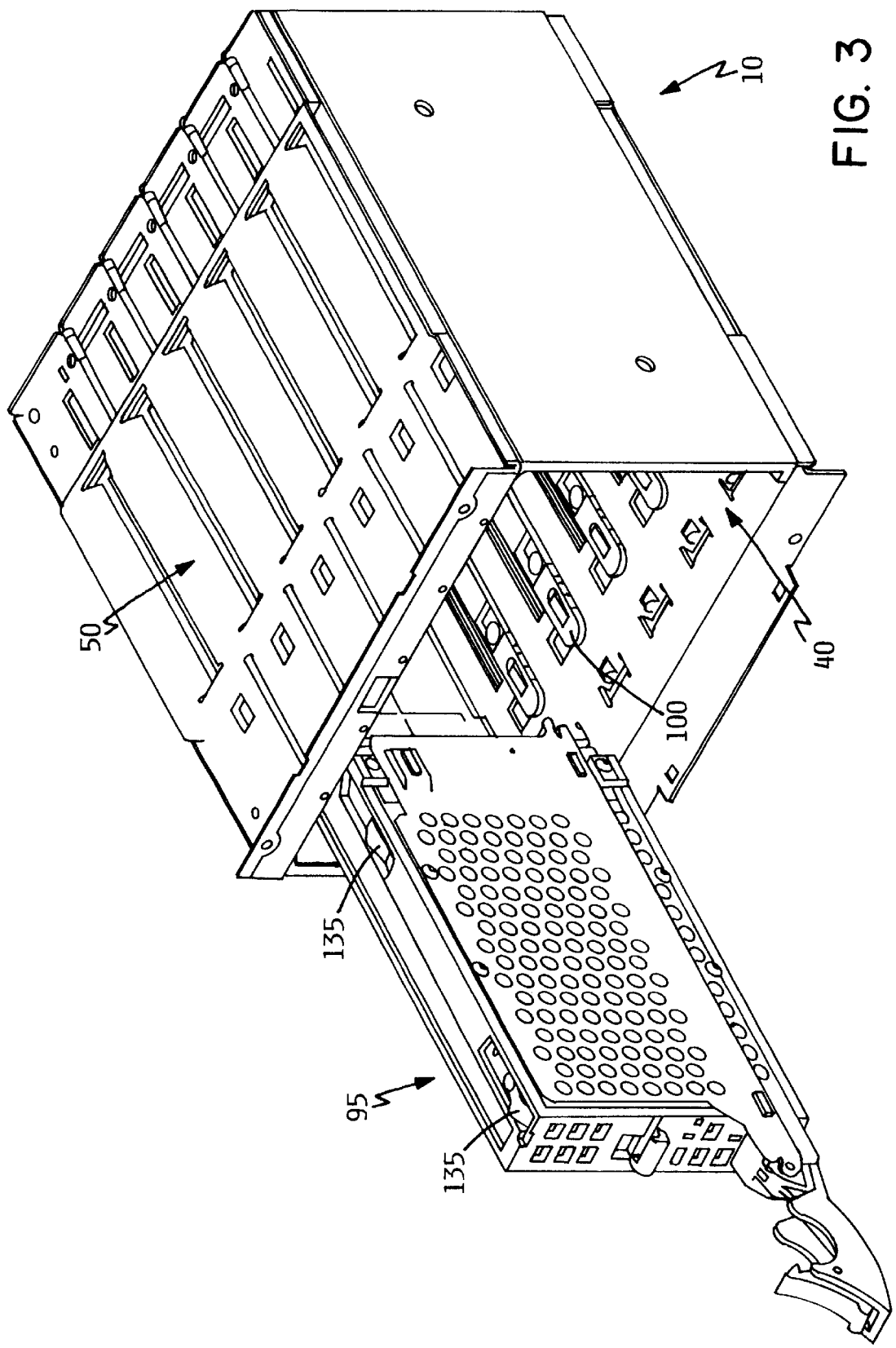
FIG. 3 is a perspective illustration of a DASD tray and associated DASD prior to insertion into the cage shown in FIG. 1.
Figure 4:
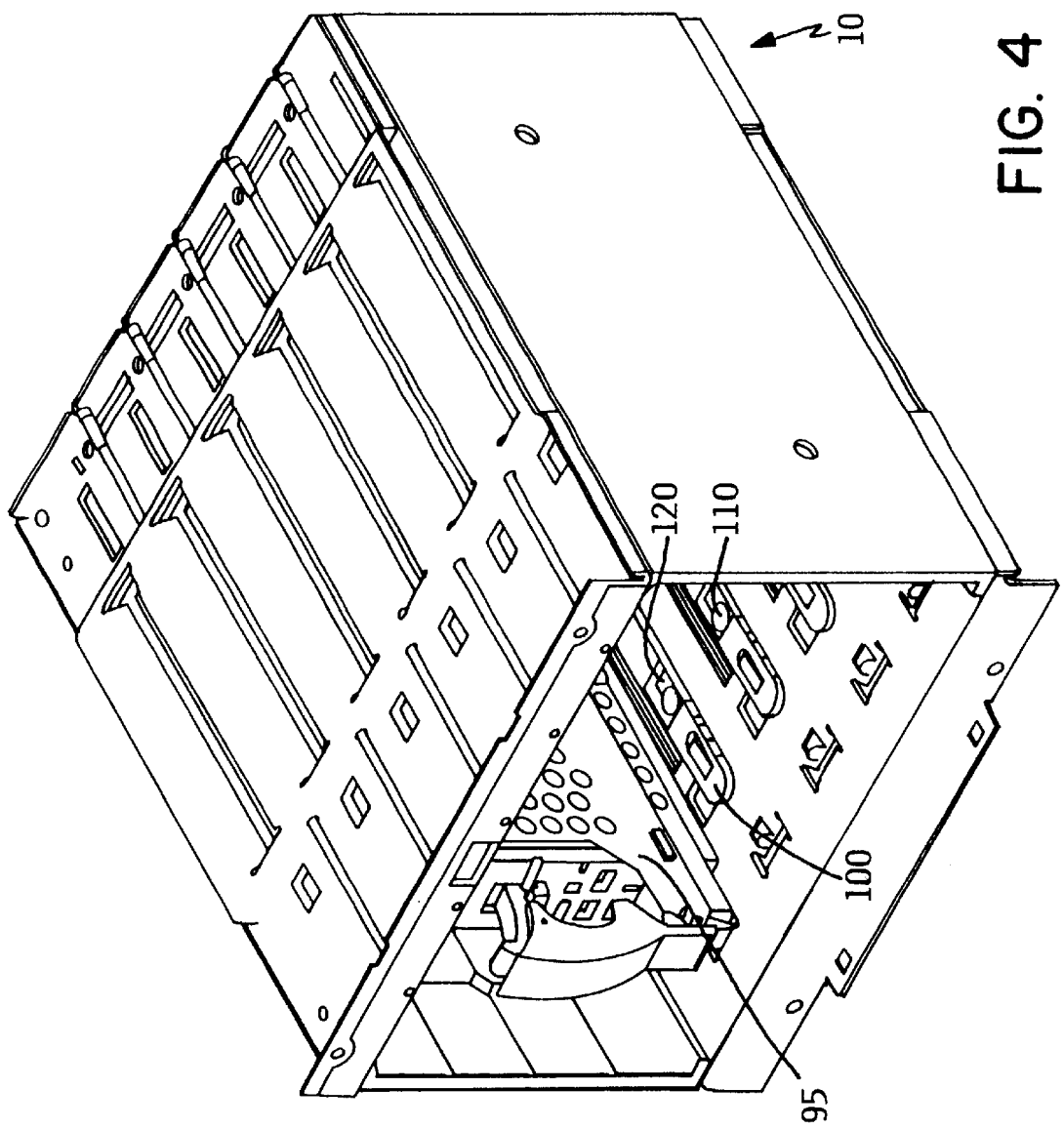
FIG. 4 is a perspective illustration of a DASD tray and associated DASD after insertion into the cage shown in FIG. 1.

The panel 90 can be stamped or machined to include features to accommodate various system needs. For example, and referring to FIGS. 3 and 4, it is conventional to guide DASD trays 95 along respective guide rails 100, each of which extends from a front of the cage 10 to the back of the cage 10. These guide rails 100 are conventionally provided in pairs (as best shown in FIG. 2), with one of the guide rails 100 of the pair being located on the floor member 40 of the cage 10, and the other one of the guide rails 100 being disposed on the roof member 50 of the cage 10. The guide rails 100 ensure that the DASD is properly aligned relative to a backplane 105 (shown only in FIG. 5), thus enabling the DASD to be easily connected to the backplane. In order to connect the guide rails 100 to the floor member 40 and the roof member 50 of the cage 10, the panels 90 are provided with tabs 110, for example, which engage with corresponding openings 120 formed in the guide rails 100.

In an exemplary embodiment, and referring also to FIG. 2, the roof member 50 and floor member 40 each include a stiffener plate 130 provided adjacent to the respective panels 90. The stiffener plates 130 are formed of galvanized sheet metal, for example, and are used to increase the structural rigidity of the roof member 50 and floor member 40. The stiffener plates 130 ensure that the DASD tray 95, which may be provided with springs 135 on its upper and/or lower edges, engages with the roof member 50 and the floor member 40 without flexing of the roof member 50 or floor member 40. Thus, the springs 135 of the DASD tray 95 will be under optimal compression at all times, ensuring accurate alignment of the DASD and minimizing vibrations thereof.

Figure 5:
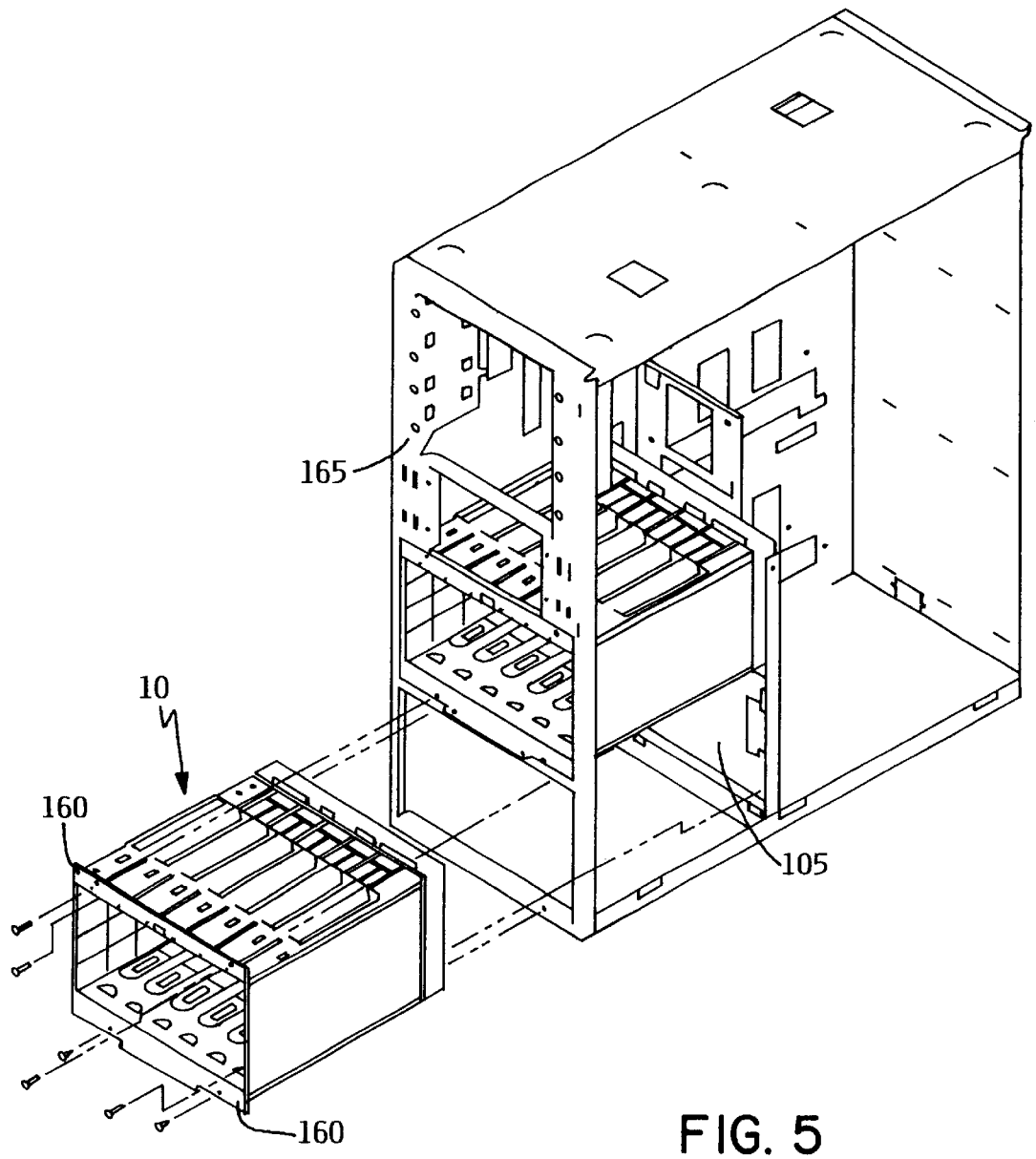
FIG. 5 is a perspective illustration of two of the cages shown in FIG. 1, in conjunction with a computer frame assembly.

As shown, the stiffener plates 130 may be provided with features that allow other components to be attached to the cage 10, or which allow the cage 10 to be easily adapted to different hardware systems. For example, in the illustrated exemplary embodiment, the stiffener plates 130 are provided with guides 140 for accommodating known light pipes 150. Moreover, in the illustrated exemplary embodiment, each stiffener plate 130 is provided with a flange 160 disposed in a region of the opening of the cage 10. As best shown in FIG. 5, the flanges 160 can be used to attach the cage 10 to a housing or frame assembly 165 of a computer, for example, using conventional fasteners.

Figure 6:
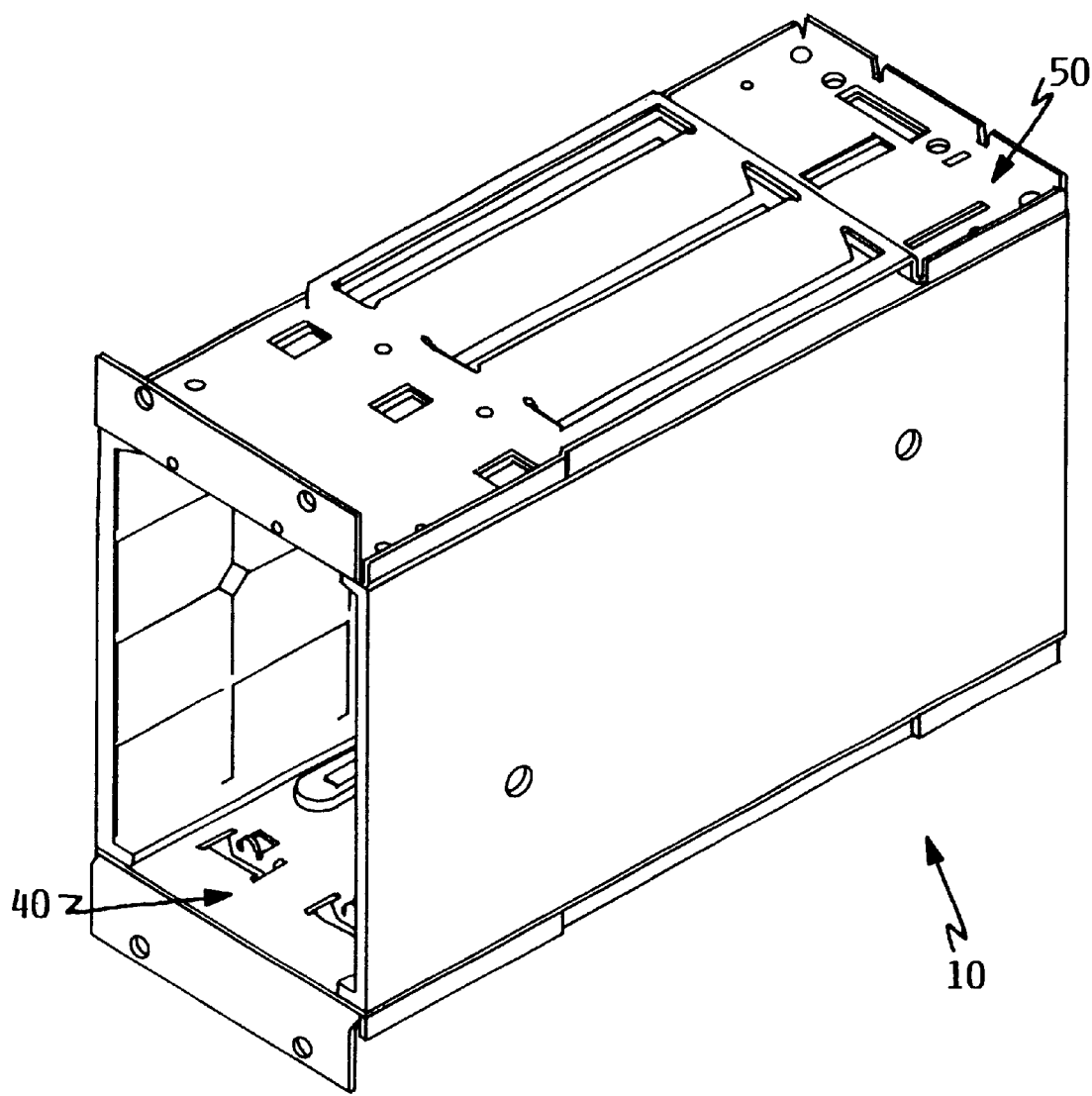
FIGS. 6–8 are perspective illustrations of various alternative exemplary embodiments of the cage according to the present invention.
Figure 7:
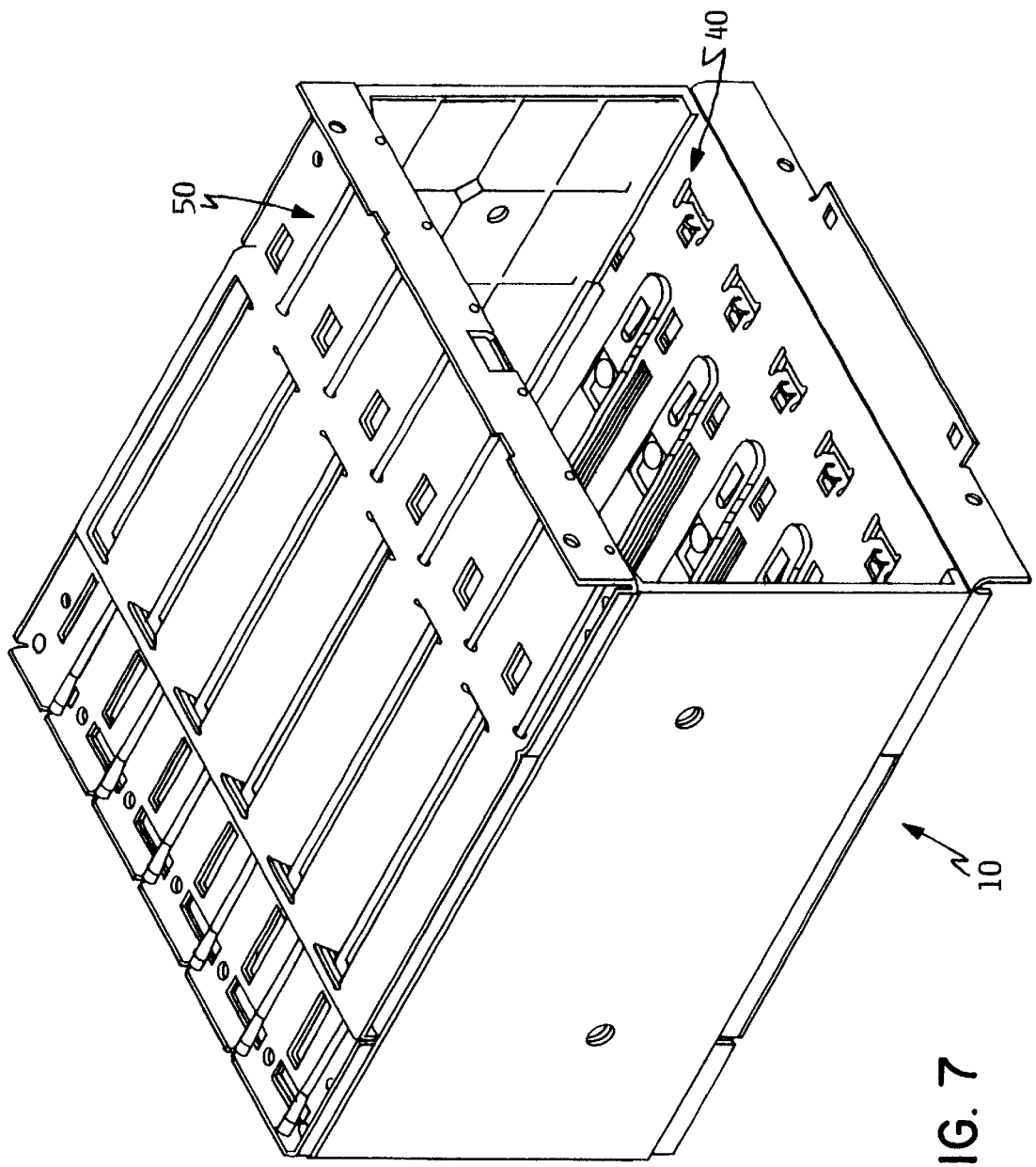
Figure 8:
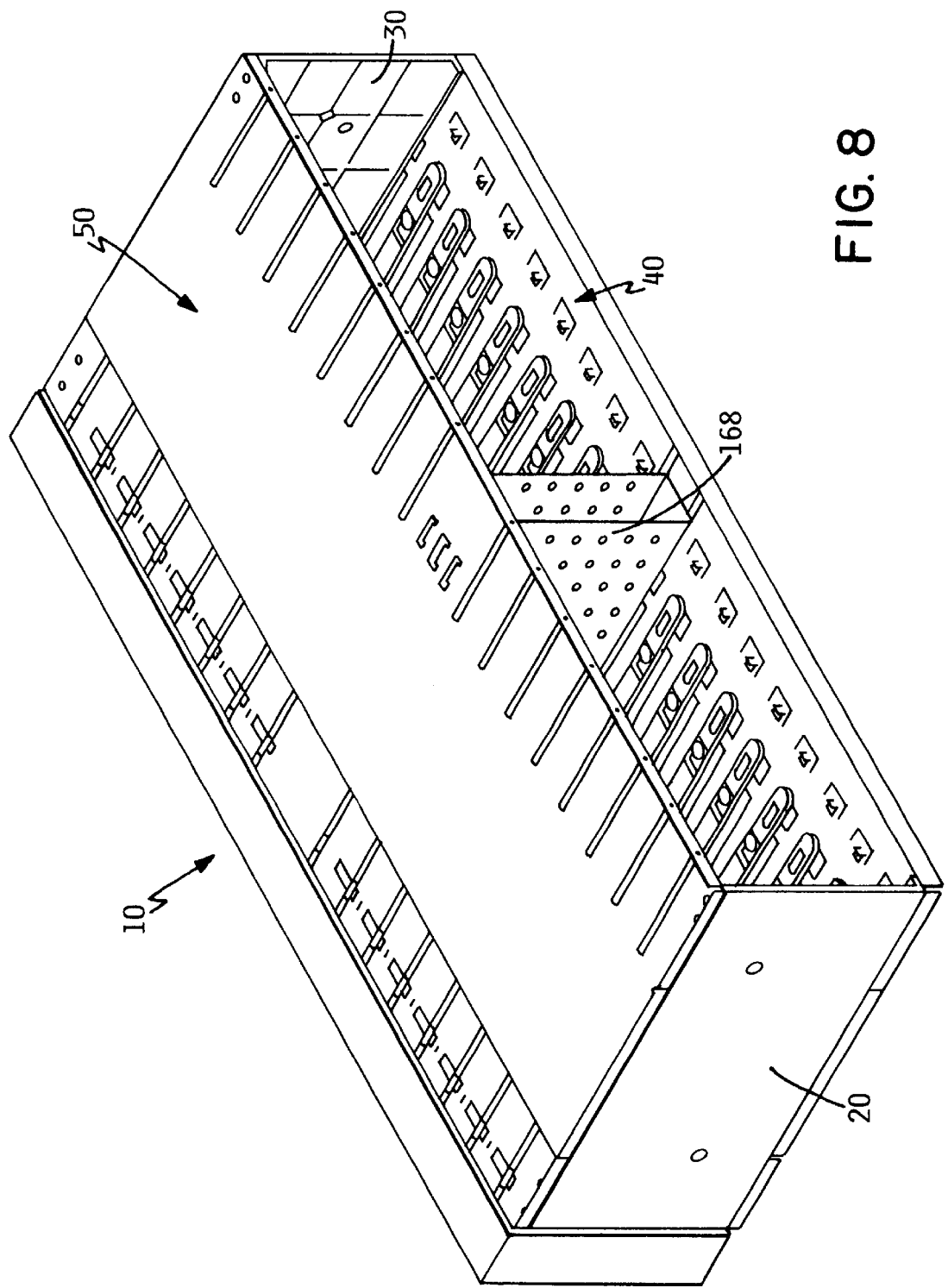

According to the present invention, the width of the roof member 50 and floor member 40 define a size of the cage 10. Thus, once a particular size of the cage is determined, the correct roof member 50 and floor member 40 are selected from a so-called kit, which includes a variety of differently sized roof members and floor members. For example, and as shown in FIG. 6, if the cage 10 is adapted to accommodate two DASDs, then the selected roof member 50 and floor member 40 will have a relatively small width, so that a relatively narrow cage 10 will be formed. On the other hand, and as shown in FIG. 7, if the cage 10 is adapted to accommodate more than one DASD, for example, six DASDs, the selected roof member 50 and floor member 40 will have a significantly greater width, so that a relatively wide cage 10 will result. As shown in FIG. 8, the present invention has been utilized to accommodate up to sixteen DASD trays, along with other components 168, using the same sized walls 20, 30 that were used to manufacture the other aforementioned cages. As will be appreciated, the present invention can thus be modified to accommodate any number of DASD trays and associated DASDs in a simple and inexpensive manner. Moreover, although the present invention has been shown to be particularly useful in accommodating DASDs and the associated trays, it is contemplated that the present invention can be utilized in a variety of applications, for example, whenever a variety of different sized cages may be needed.

As best shown in FIG. 2, to further reduce any flex of the roof member 50 and the floor member 40, the cage 10 may be provided with a back support 170 disposed toward a rear of the cage 10. The back support 170 is preferably a thin column that connects the roof member 50 to the floor member 40, using threaded fasteners, for example. In the exemplary embodiment, the column has a width of about 1 cm, for example. Moreover, the back support 170 is preferably located so that it does not interfere with the connection of the DASD to the backplane, or significantly impede the flow of cooling air through the cage 10. For example, in the exemplary illustrated embodiment, the back support 170 is disposed behind one of the guide rails 100. Thus, the back support 170 does not impede the flow of air between adjacent guide rails, for example, any more so than the DASD tray received by the guide rail. Moreover, the back support 170 is slightly offset relative to the guide rail 100, which allows the connector (not shown) of the DASD, which is also typically offset, to be plugged into the backplane. Other arrangements are also within the scope of the invention.

In summary, due to the modular first and second walls 20, 30, the cage 10 according to the present invention can be accurately made, without dimensional variations in the manufactured cages. As such, the cage 10 will accurately align the DASD relative to the backplane, as these two components are plugged together.

Further, the cast walls 20, 30 allow the height of the cage 10 to be held within close tolerances. Thus, each resulting cage 10 will hold the springs of the DASD tray at an optimal compression.

Moreover, the cage 10 can be modified in size and application using a minimal amount of design time and necessary tooling. That is, the same walls 20, 30 can be used for a large number of differently configured cages 10, by merely using different panels 90 and stiffener plates 130 for the roof member 50 and floor member 40. Thus, a differently configured cage 10 can be built on the manufacturing floor.

Further, a variety of mounting features can be utilized with the cage 10, simply by modifying the stiffener plates 130 in an appropriate manner, without affecting the operational characteristics of the cage 10. That is, the vibration damping features of the present invention are determined primarily by the cast walls 20, 30, and the DML panel 90.

Further, the cast walls, due to their rigidity, allow the DML panels to be adequately supported and utilized in the cage. This provides a cage that can be manufactured at a lower cost than the prior art cages.

Moreover, the cage 10 significantly reduces vibrations that may otherwise affect the operation of the direct access storage device. Thus, a direct access storage device utilized in a cage 10 manufactured in accordance with the present invention will be subjected to fewer soft errors, thus increasing the operational speed of the device.

It should be understood, however, that the invention is not necessarily limited to the specific arrangement and components shown and described above, but may be susceptible to numerous variations within the scope of the invention.

It will be apparent to one skilled in the art that the manner of making and using the claimed invention has been adequately disclosed in the above-written description of the preferred embodiments taken together with the drawings. For example, the inventive concept can be applied using various types of electronic components having edge connectors for mating with slot connectors on computer system motherboards and backplanes. For example, a number of standard components are currently in use, which may be applied with the present invention. These include ISA (Industry Standard Architecture—8/16 bits) and EISA (Expanded ISA—32 bits), SCSI (Small Computer System Interconnect), PCI (Peripheral Component Interconnect), MCA (Micro Channel Architecture), VLB (VESA Local Bus), AGP (Accelerated Graphics Port), and USB (Universal System Bus), to name just a few.

It will be understood that the above description of the preferred embodiments of the present invention are susceptible to various modifications, changes, and adaptations, and the same are intended to be comprehended within the meaning and range of equivalents of the appended claims.

What is claimed is:

1. A cage for an electronic component, comprising:
   two spaced apart modular, rigid, casted and interchangeable walls; and
   a roof member and a floor member removably connected to said two spaced apart walls;
   wherein said roof member and said floor member are each comprised of a prefabricated damped metallic laminate panel.

2. The cage recited in claim 1, wherein said walls are substantially identical, wherein said roof member is essentially parallel to said floor member, and wherein said two spaced apart walls are essentially parallel to each other, said spaced apart walls, said roof member and said floor member being connected together to form a parallelepiped configuration.

3. The cage recited in claim 1, wherein said walls are comprised of casted zinc aluminum.

4. The cage recited in claim 1, wherein said roof member and said floor member are each additionally comprised of a stiffener plate disposed adjacent to a respective damped metallic laminate panel.

5. The cage recited in claim 1, wherein said cage further includes at least two guide rails adapted to guide the electronic component therein, one of said guide rails being disposed on the roof member, and the other of the guide rails being disposed on the floor member.

6. The cage recited in claim 5, wherein said cage has an open front and an open rear;
   further comprising a back support connected to said floor member and said roof member, said back support being disposed across the open rear of said cage and behind said guide rails, and having a width so selected that a majority of the rear of said cage remains open.

7. The cage recited in claim 1, wherein said walls are provided with locating pins along respective edges thereof, and said roof member and said floor member are each provided with openings for receiving the locating pins.

8. The cage recited in claim 1, wherein each of said walls has a thickness of about 2 mm to about 3 mm.

9. A modular cage assembly for an electronic component, comprising:
   two spaced apart common rigid walls; and
   a kit comprising at least two differently sized roof members, and at least two differently sized floor members, each being selectively and removably connectable to said two spaced apart common rigid walls to form a cage with one of a plurality of different configurations.

10. The modular cage assembly recited in claim 9, wherein each of said roof members and floor members have essentially the same length.

11. The modular cage assembly recited in claim 10, wherein the length of each of the roof members and each of the floor members is essentially the same as a length of the walls.

12. The modular cage assembly recited in claim 10, wherein a width of the at least two differently sized roof members is different, and wherein a width of the at least two differently sized floor members is different.

13. The modular cage assembly recited in claim 9, wherein when a selected roof member and floor member are connected to said walls, said selected roof member is essentially parallel to said selected floor member, and said two spaced apart common rigid walls are essentially parallel to each other, to collectively form a parallelepiped configuration.

14. The modular cage assembly recited in claim 9, wherein said walls are substantially identical.

15. The modular cage assembly recited in claim 9, wherein said roof members and said floor members of said kit are each comprised of a damped metallic laminate panel.

16. The modular cage assembly recited in claim 15, wherein said roof members and said floor members of said kit are each additionally comprised of a stiffener plate disposed adjacent to a respective damped metallic laminate panel.

17. The modular cage assembly recited in claim 9, further comprising at least two guide rails adapted to guide the electronic component therein, one of said guide rails being disposed on a selected roof member, and the other of the guide rails being disposed on a selected floor member.

18. The modular cage assembly recited in claim 9, wherein said walls are provided with locating pins along respective edges thereof, and said roof members and said floor members of said kit are each provided with openings for receiving the locating pins.

19. The modular cage assembly recited in claim 9, wherein each of said walls has a thickness of about 2 mm to about 3 mm.

20. The modular cage assembly recited in claim 9, wherein each of said walls is comprised of casted zinc aluminum.

21. A method of manufacturing a modular cage for accommodating an electrical component, comprising:
   providing two spaced apart common rigid walls;
   providing a kit having at least two differently sized roof members, and at least two differently sized floor members;
   selecting, from the kit, one of said roof members and one of said floor members; and
   connecting the selected one roof member and the selected one floor member to said two spaced apart common rigid walls.

22. The method recited in claim 21, wherein said providing two spaced apart rigid walls includes providing substantially identical walls.

23. The method recited in claim 21, wherein said providing a kit includes providing all of the roof members and floor members with essentially the same length.

24. The method recited in claim 23, wherein said providing a kit includes providing the at least two differently sized roof members with different widths, and providing the at least two differently sized floor members with different widths.

25. The method recited in claim 21, wherein said providing a kit includes forming the at least two differently sized roof members, and the at least two differently sized floor members, from a damped metallic laminate panel.

26. The method recited in claim 25, wherein said forming the at least two differently sized roof members and the at least two differently sized floor members includes disposing a stiffener plate adjacent to a respective damped metallic laminate panel.

27. The method recited in claim 21, further comprising providing a first guide rail on the selected roof member, and providing a second guide rail on the selected floor member.

28. The method recited in claim 21, wherein said providing two spaced apart common rigid walls includes forming locating pins along respective edges thereof; further comprising positioning and aligning the selected roof member and the selected floor member relative to the walls using the locating pins.

29. The method recited in claim 21, wherein said providing two spaced apart common rigid walls includes casting the walls.

30. The method recited in claim 29, wherein the casting includes casting the walls from zinc aluminum.

31. A computer system, comprising:
   a computer frame assembly;
   a backplane disposed within the computer frame assembly;
   a cage, including:
      two spaced apart cast walls; and
      a roof member, and a floor member, each being removably connectable to said two spaced apart cast walls; and
   an electrical component disposed within the cage and connected to said backplane;
   wherein said walls comprise casted zinc aluminum; and
   wherein said roof member and said floor member are each comprised of a damped metallic laminate panel.

32. The computer system recited in claim 31, wherein said roof member and said floor member are each additionally comprised of a stiffener plate disposed adjacent to a respective damped metallic laminate panel.

33. The computer system recited in claim 32, wherein said cage further includes at least one first guide rail disposed on the roof member, and at least one second guide rail disposed on the floor member, said guide rails extending from a front of the cage, toward a rear of the cage, and terminating in front of said backplane, said guide rails guiding the electrical component through the cage and into electrical engagement with the backplane.

34. The computer system recited in claim 33, wherein said electrical component comprises a direct access storage device.

35. The computer system recited in claim 31, wherein each of said walls has a thickness of about 2 mm to about 3 mm.

* * * * *